(12) United States Patent
Savich

(10) Patent No.: US 9,983,251 B2
(45) Date of Patent: May 29, 2018

(54) GROUNDING MONITORING DEVICE

(71) Applicant: Desco Industries, Inc., Chino, CA (US)

(72) Inventor: Siarhei V. Savich, Chino Hills, CA (US)

(73) Assignee: Desco Industries, Inc., Chino, CA (US)

(*) Notice: Subject to any disclaimer, the term of this patent is extended or adjusted under 35 U.S.C. 154(b) by 47 days.

(21) Appl. No.: 15/028,148

(22) PCT Filed: Nov. 17, 2014

(86) PCT No.: PCT/US2014/065919
§ 371 (c)(1),
(2) Date: Apr. 8, 2016

(87) PCT Pub. No.: WO2015/077178
PCT Pub. Date: May 28, 2015

(65) Prior Publication Data
US 2016/0238650 A1 Aug. 18, 2016

Related U.S. Application Data

(60) Provisional application No. 61/906,957, filed on Nov. 21, 2013.

(51) Int. Cl.
*G01R 31/26* (2014.01)
*G01R 31/02* (2006.01)
*H05F 3/02* (2006.01)

(52) U.S. Cl.
CPC ............ *G01R 31/026* (2013.01); *H05F 3/02* (2013.01)

(58) Field of Classification Search
CPC ......... G01R 31/026; H05F 3/02; G08B 21/00; H02H 1/00

(Continued)

(56) References Cited

U.S. PATENT DOCUMENTS

| 4,558,309 A | 12/1985 | Antonevich |
| 4,745,519 A | 5/1988 | Breidegam |
| 6,930,612 B1* | 8/2005 | Kraz .................... G08B 21/185 340/649 |

FOREIGN PATENT DOCUMENTS

WO WO2015077178 A1 5/2015

OTHER PUBLICATIONS

International Search Report, dated Sep. 2, 2015,International Application No. PCT/2014/065919, 2 pages.

(Continued)

*Primary Examiner* — Melissa Koval
*Assistant Examiner* — Trung Nguyen
(74) *Attorney, Agent, or Firm* — Berkeley Law & Technology Group, LLP

(57) ABSTRACT

A grounding monitoring device is disclosed herein. In a described embodiment, the grounding monitoring device comprises a wrist strap comprising a first conductive portion for providing a first discharge path between a human arm and a ground; and a second conductive portion electrically isolated from the first conductive portion for providing a different second discharge path between the human arm and the ground. The grounding monitoring device further comprises a bipolar control voltage generator for applying a first voltage at a frequency $f_0$ to the first conductive portion and an opposite second voltage at the frequency $f_0$ to the second conductive portion; and an electrical circuit for: receiving a first total signal from the first conductive portion; receiving a second total signal from the second conductive portion; and forming an output signal based on a differential and common mode gains of the electrical circuit. The grounding monitoring device further comprises a comparator for comparing a portion of the output signal that corresponds to the frequency $f_0$ with a first threshold value; and comparing a portion of at least one of the first total signal and the second (Continued)

total signal that corresponds to the frequency $f_0$ with a second threshold value; wherein an alarm signal is activated depending on the comparisons made by the comparator.

16 Claims, 3 Drawing Sheets

(58) Field of Classification Search
USPC ...... 324/500, 537, 750.01–750.02, 509, 688, 324/528, 533, 602–612, 681; 340/649–664, 561
See application file for complete search history.

(56) References Cited

OTHER PUBLICATIONS

Written Opinion of the International Searching Authority, dated Sep. 2, 2015, International Application No. PCT/2014/065919, 6 pages.
JP Office Action, dispatched Oct. 31, 2017; App. No. JP 2016-528013, 11 pages.

\* cited by examiner

GROUNDING MONITORING DEVICE

TECHNICAL FIELD

This invention relates to a grounding monitoring device.

BACKGROUND

Existing dual wrist strap operator ground monitors are primary based on measurements of a resistance or impedance of a human body to indicate proper connection to a wrist strap. In general, the wrist strap comprises two separated conductive parts which are in direct contact with the wrist of a person's hand (i.e. the user). When a control voltage is applied between these two parts, it causes current flow through the skin of the wrist and the resistance of the current flow may be obtained by measuring a voltage across the two conductive parts since the resistance varies proportionately with the measured voltage.

The obtained resistance has a resistance value which is compared with a predetermined threshold (usually 10 MOhm or 35 MOhm) and when the threshold is exceeded, an alarm is generated which may take the form of a warning sound, light or both. In critical environments, it is even more important that static charge does not build up within the user's body and thus, the stability and reliability of the monitors are critical. However, the applied control voltage may be as high as 16V DC and while this is safe for the user, this may cause problems for sensitive electronic devices. Moreover, continuous wearing of the wrist strap may cause discomfort for the user. It is therefore quite understandable to reduce the level of the applied control voltage.

A few solutions have been proposed to reduce the user's exposure to the high applied control voltage. One of them is to use a pulse control signal, instead of a 16V DC signal. A disadvantage of using the pulse control signal is that the resistance monitoring is not continuous since there is no monitoring during the time period between control pulses. An alternative technique is to apply a control signal having two equal voltages with opposite polarities to the respective conductive parts of the wrist strap to achieve zero or close to zero resultant voltage experienced by the user. However, this technique does not work well when there are differences in the contact quality between the two conductive parts of the wrist strap and the wrist of the user and this may create unwanted charge which may damage ESD sensitive components.

A further alternative solution involves the use of an applied voltage signal in a special form which is digitally filtered to decrease the user's exposed voltage level to less than a couple of tens of millivolts. However, such types of monitors may be affected by certain forms of external electromagnetic noises created by surrounding equipment that makes the monitoring results unreliable.

It is an object of the present invention to provide a grounding monitoring device to address at least one of the disadvantages of the prior art and/or to provide the public with a useful choice.

SUMMARY

In accordance with a first aspect, there is provided a grounding monitoring device, comprising a wrist strap comprising a first conductive portion for providing a first discharge path between a human part and a ground; and a second conductive portion electrically isolated from the first conductive portion for providing a different second discharge path between the human part and the ground. The grounding monitoring device also comprises a signal source for applying a first voltage at a frequency to the first conductive portion and an opposite second voltage at the frequency to the second conductive portion; an electrical circuit for: receiving a first total signal from the first conductive portion; receiving a second total signal from the second conductive portion; forming an output signal based on a differential and common mode gains of the electrical circuit; and a comparator for: comparing a portion of the output signal that corresponds to the frequency with a first threshold value; and comparing a portion of at least one of the first total signal and the second total signal that corresponds to the frequency with a second threshold value; wherein an alarm signal is activated depending on the comparisons made by the comparator.

In the context of this application, the use of the term "wrist strap" is not limited to being used on a user's wrist. Instead, the term "wrist strap" is used in a broad sense to mean in general any antistatic or ESD strap which may be worn by a user to provide a discharge path from a part of the user (i.e. human) to ground. The part of the user may include the wrist, arm, heel, ankle etc or any part of the human.

An advantage of the described embodiment is that the grounding monitoring device is provided with additional "protection" from industrial electromagnetic noises in order to reduce or avoid false alarms.

Specifically, with at least one additional channel in the measurement, this makes it possible to eliminate or reduce the impact of external noises in a manufacturing environment and further provides information of the presence of such noises.

Preferably, each of the first and second discharge paths may comprise at least one resistor. Each of the first and second discharge paths may comprises a same first resistor and a same second resistor. It is envisaged that the signal source may comprise a bipolar signal source, although other types of signal source may be used too.

Optionally, the first and second voltages have a same amplitude, and as an example, each of the first and second voltages may be a square wave at the frequency, the first voltage ranging from zero to $V_{max}$, and the second voltage ranging from $V_{max}$ to zero. The frequency is carefully selected and preferably, it may not be 50 or 60 Hz, or a harmonic of 50 or 60 Hz. Advantageously, the frequency is less than 50 Hz. In an embodiment, the frequency is 20 Hz, but other frequencies are possible.

Preferably, the electrical circuit comprises at least two operational amplifiers. The electrical circuit may comprise at least two impedances.

Specifically, the comparator may comprise: a first comparator for comparing the portion of the output signal that corresponds to the frequency with the first threshold value; and a different second comparator for comparing the portion of at least one of the first total signal and the second total signal that corresponds to the frequency with the second threshold value.

The comparator may also comprise a filter for extracting: the portion of the output signal that corresponds to the frequency; and the portion of at least one of the first total signal and the second total signal that corresponds to the frequency. In an embodiment, the filter may comprise: a first filter for extracting the portion of the output signal that corresponds to the frequency; and a different second filter for extracting the portion of at least one of the first total signal and the second total signal that corresponds to the frequency.

It is envisaged that the alarm signal may be generated under various conditions depending on how the grounding monitoring device is configured. For example, the alarm signal may be generated if: the portion of the output signal that corresponds to the frequency is greater than the first threshold value; and the portion of at least one of the first total signal and the second total signal that corresponds to the frequency is less than the second threshold value.

In another example, the alarm signal may be generated if: the portion of the output signal that corresponds to the frequency is greater than the first threshold value; and the portion of each one of the first total signal and the second total signal that corresponds to the frequency is less than the second threshold value.

In a further example, the alarm signal may not generated if: the portion of the output signal that corresponds to the first frequency is greater than the first threshold value; and the portion of at least one of the first total signal and the second total signal that corresponds to the frequency is greater than the second threshold value.

It should be appreciated that the first total signal may comprise at least a portion of the first voltage; and the second total signal comprises at least a portion of the second voltage. At least one of the first and second total signals may comprise a noise signal at least at the frequency. A ratio of an amplitude of the noise signal to an amplitude of the first or second voltage may be at least 20.

Preferably, the electrical circuit may comprise: a first resistor having a first value connecting a first output terminal of the signal source to the first conductive portion and to a non-inverting input of a first operational amplifier; a second resistor having a second value connecting the first output terminal of the signal source to the ground; a third resistor having the first value connecting a second output terminal of the signal source to the second conductive portion and to a non-inverting input of a second operational amplifier; and a fourth resistor having the second value connecting the second output terminal of the signal source to the ground. An output of the first operational amplifier may be connected to an inverting input of the first operational amplifier; and an output of the second operational amplifier may be connected to an inverting input of the second operational amplifier.

In a specific configuration of one embodiment, a first impedance having a first value may connect the output of the first operational amplifier to a non-inverting input of a third operational amplifier; a second impedance having a second value may connect the non-inverting input of the third operational amplifier to the ground; a third impedance having the first value may connect the output of the second operational amplifier to an inverting input of the third operational amplifier; and a fourth impedance having the second value may connect the inverting input of the third operational amplifier to the ground.

Preferably, the comparator may compare a portion of an output signal of the third operational amplifier that corresponds to the first frequency with the first threshold value; and may compare the portion of at least one of the output signals of the first and second operational amplifiers that corresponds to the first frequency with the second threshold value.

It should be appreciated that the wrist strap may be provided separately from the grounding monitoring device and this forms a second aspect, in which there is provided a grounding monitoring device adapted to be connected to a wrist strap, the wrist strap comprising a first conductive portion for providing a first discharge path between a human part and a ground; and a second conductive portion electrically isolated from the first conductive portion for providing a different second discharge path between the human part and the ground, the grounding monitoring device comprising: a signal source for applying a first voltage at a frequency to the first conductive portion and an opposite second voltage at the frequency to the second conductive portion. The grounding monitoring device further comprises an electrical circuit for: receiving a first total signal from the first conductive portion; receiving a second total signal from the second conductive portion; forming an output signal based on a differential and common mode gains of the electrical circuit; and a comparator for: comparing a portion of the output signal that corresponds to the first frequency with a first threshold value; and comparing a portion of at least one of the first total signal and the second total signal that corresponds to the first frequency with a second threshold value; and wherein an alarm signal is activated depending on the comparisons made by the comparator.

It should be appreciated that features relating to one aspect may also be applicable to the other aspect.

BRIEF DESCRIPTION OF DRAWINGS

Examples of the invention will now be described with reference to the accompanying drawings, in which.

DETAILED DESCRIPTION

Figure 1:
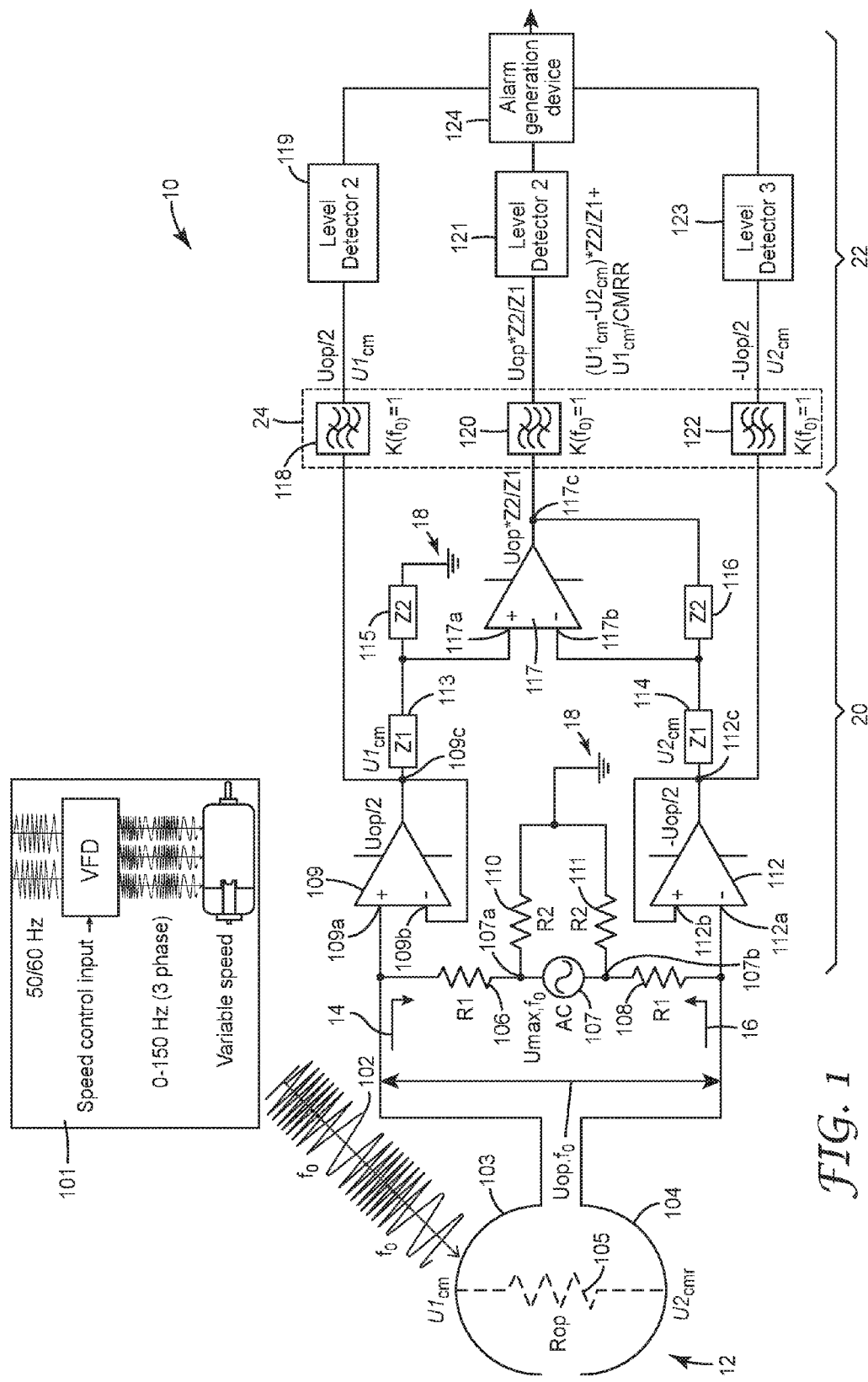
FIG. 1 illustrates a schematic circuit diagram of a grounding monitoring device according to a preferred embodiment.

FIG. 1 illustrates a schematic circuit diagram of a grounding monitoring device 10 according to a preferred embodiment. The grounding monitoring device 10 includes a wrist strap 12 having a first conductive portion 103 and a second conductive portion 104 electrically isolated from the first conductive portion 103. Such a wrist strap 12 is commonly called a "dual" wrist strap since the first and conductive portions 103,104 provide respective first and second discharge paths 14,16 between a user wearing the wrist strap 12 (i.e. the user's arm) and ground 18. When the wrist strap 20 is worn by the user, the user's resistance as "seen" by the grounding monitoring device 10 is shown as an equivalent skin resistor 105 (shown as broken lines in FIG. 1) with a value of $R_{op}$.

The grounding monitoring device 10 further includes a signal source for applying a first voltage at a control voltage frequency to the first conductive portion 103 and an opposite second voltage at the control voltage frequency to the second conductive portion 104 and in this embodiment, the signal source includes a bipolar control voltage generator 107 which produces a reference sine signal with a voltage amplitude of $+/-U_{max}$ and a control voltage frequency $f_0$. In other words, the voltage amplitude $+U_{max}$ is applied at the first conductive portion 103 and the opposite voltage amplitude $-U_{max}$ is applied at the second conductive portion 104. In this embodiment, the voltage amplitude Umax of the reference sine signal is 30 mV which is much lower than convention grounding monitors which typically use 16V DC. In this way, this reduces the chance of the reference sine signal affecting ESD sensitive components in close proximity to the user.

The grounding monitoring device 10 also includes an electrical circuit 20 for receiving signals from the first and second conductive portions 103,104 and a comparator 22 whose output is used to activate an alarm signal. These will be elaborated next.

First and second output terminals 107a,107b of the bipolar control voltage generator 107 are electrically connected to the respective first and second conductive portions 103, 104 via corresponding resistors 106, 110, 108, 111 of the electrical circuit 20. Specifically, the first output terminal 107a is electrically coupled to the first conductive portion 103 via a first resistor 106 and the first output terminal 107a is also coupled to a second resistor 110 to the ground 18. In this way, the first discharge path 14 is formed between the first conductive portion 103 and the ground 18 via the first and second resistors 106,110 in series and this provides an electrically safe dissipative path for static discharge.

The second output terminal 107b, on the other hand, is electrically coupled to the second conductive portion 104 via a third resistor 108 and the second output terminal 107b is also coupled to a fourth resistor 111 to the ground 18. In this way, the second discharge path 16 is formed between the second conductive portion 104 and the ground 18 via the third and fourth resistors 108,111 in series and this provides another electrically safe dissipative path for static discharge.

The first and third resistors 106,108 have a same value of R1, whereas the second and fourth resistors 110,111 have a same value of R2. However, it should be appreciated that this may not be the case and the values of the resistors 106, 108, 110, 111 may differ from each other.

As it can be appreciated from FIG. 1, when the wrist strap 12 is worn by a user, the equivalent skin resistor 105, bipolar control voltage generator 107, the first and third resistors 106,108 form a closed-loop where a differential voltage $U_{op}$ between the first and second conductive portions 103,104 may be measured. Since the differential voltage $U_{op}$ varies proportionally to the value $R_{op}$ of the equivalent skin resistance 105, it is possible to determine the equivalent skin resistance 105 by measuring the differential voltage $U_{op}$.

In this embodiment, the electrical circuit 20 includes three operational amplifiers (op amps) 109, 112, 117 configured as an instrumentation amplifier with the first and second op amps 109,112 configured with negative feedback, and the third op amp 117 configured as a differential amplifier. Specifically, the first output terminal 107a of the bipolar control voltage generator 107 is coupled to a non-inverting input 109a of the first op amp 109 via the first resistor 106 (which in turn is coupled to the first conductive portion 103) and an inverting input 109b of the first op amp 109 is coupled to an output 109c of the first op amp 109. The output 109c of the first op amp 109 is also coupled to a non-inverting input 117a of the third op amp 117 via a first impedance 113 having a value Z1. The non-inverting input 117a of the third op amp 117 is also connected to the ground 18 via a second impedance 115 having a value Z2.

Further, the second output terminal 107b of the bipolar control voltage generator 107 is coupled to a non-inverting input 112a of the second op amp 112 via the third resistor 108 (which in turn is coupled to the second conductive portion 104) and an inverting input 112b of the second op amp 112 is coupled to an output 112c of the second op amp 112. The output 112c of the second op amp 112 is also coupled to an inverting input 117b of the third op amp 117 via a third impedance 114 having a value Z1 (i.e. same value as the first impedance 113). The inverting input 117b of the third op amp 117 is also connected to an output 117c of the third op amp 117 via a fourth impedance 116 having a value Z2 (i.e. same value as the second impedance 115).

The outputs 109c, 112c, 117c of the first, second and third op amps 109, 112, 117 are coupled to a filter 24 of the comparator 22 and in this embodiment, the filter 24 includes a first digital band pass filter 120 for filtering the output 117c of the third op amp 117 and the first digital band pass filter's output is coupled to a first level detector 121. The filter 24 further includes a second filter in the form of a second and third digital band pass filters 118,122 which are coupled respectively to the outputs 109c,112c of the first and second op amps 109,112. The outputs of the second and third digital band pass filters 118,122 are in turn coupled to respective second and third level detectors 119,123.

The comparator 22 further includes an alarm generation device 124 for generating the alarm signal based on results of the comparator 22.

An operation of the grounding monitoring device 10 will next be described.

It should be appreciated that in practice, the grounding monitoring device 10 is used in an industrial environment such as a manufacturing environment where there are machines and power lines in close proximity to the user of the grounding monitoring device 10. As a result, the first and second conductive portions 103,104 of the wrist strap 12 may be exposed to electromagnetic noise of significant amplitude that may distort the measurement of the differential voltage $U_{op}$, and indeed, the noise may introduce a common mode voltage which is experienced by both the first and second conductive portions 103,104. In FIG. 1, a variable frequency drive (VRD) 101 is illustrated which generates a noise signal 102 that induces a common mode voltage $U1_{cm}$ at the first conductive portion 103 and $U2_{cm}$ at the second conductive portion 104. Further, like other machines or equipments, the VRD 101 induces a 50/60 Hz signal which may affect the accuracy of the grounding monitoring device 10. The following explains how the grounding monitoring device 10 of this embodiment is configured to eliminate or mitigate the influence of noise during the monitoring process and to separate useful information (i.e. the $U_{op}$) from the noise component.

First, the control voltage frequency $f_0$ of the bipolar control voltage generator 107 is selected to have a spectrum different from persisting noise signals typical to a manufacturing environment in order to increase the signal to noise ratio. Indeed, it is preferred that the control voltage frequency $f_0$ is not selected to be 50 Hz or 60 Hz, or not a harmonic of 50 or 60 Hz. It is preferred for the control voltage frequency $f_0$ to be less than 50 Hz and in this embodiment, the control voltage frequency $f_0$ is selected to be 20 Hz to mitigate the influence of noise on the proper functioning of the grounding monitoring device 10.

Second, the electrical circuit 20 is arranged to receive a first total signal from the first conductive portion 103 and a second total signal from the second conductive portion 104 and to form an output signal based on a differential and common mode gains of the electrical circuit 20. At least one of the first and second total signals may comprise a noise signal at least at the frequency $f_0$ and a ratio of the amplitude of the noise signal to the amplitude of the first and second voltage may be at least 20. Initially, the output 109c of the first op amp 109 may be represented by $U_{op}/2$ and $U1_{cm}$, respectively the wanted and unwanted components (i.e. the first total signal after being processed by the first op amp 109). Similarly, the output 112c of the second op amp 112 may be represented by $-U_{op}/2$ and $U2_{cm}$ (as the second total signal after being processed by the second op amp 112). The arrangement of the first, second and third op amps 109, 112, 117 thus provides the gain for the differential voltage $U_{op}$ and rejects or reduces the common mode voltages $U1_{cm}$ and $U2_{cm}$. However, it is appreciated that the values of $U1_{cm}$ and $U2_{cm}$ may not be exactly the same and component tolerances and accuracy may also cause non-symmetry in the characteristics of the electrical circuit 20. The values of $U1_{cm}$ and $U2_{cm}$ may be different because of difference in connection quality or reasons when one of the conductive portions 103,104 is exposed to some electromagnetic noise while the other conductive portion 103,104 is shielded from the noise (for example, due to the position of the user's hand). As a result, the difference between the common mode voltages ($U1_{cm}-U2_{cm}$) after amplification (by the first and second op amps 109,112) and present at the inputs 117a,117b of the third op amp 117 may create some unwanted voltage component at the output 117c of the third op amp 117.

It should be appreciated that the gain of the electrical circuit 20 (i.e. the instrumentation amplifier) is defined by the values of the first to fourth impedances 113, 114, 115, 116 and since the first impedance 113 and the third impedance 114 have the same value (Z1), and the second impedance 115 and the fourth impedance 116 has the same value (Z2), the gain may be expressed as a ratio of Z2 and Z1. Mathematically, the output 117c of the third op amp 117 based on the differential gain may be represented by:

$$U_{op} * \frac{Z2}{Z1} \quad (1)$$

It should be appreciated that the values Z2 and Z1 of the impedances 113, 114, 115, 116 are complex in general since the third op amp 117 may provide a function of preliminary analog filtration as well. In view of tolerances of analog filter components (such as capacitors' accuracies), the electrical circuit 20 may also provide the common mode gain for the common mode voltages $U1_{cm}$ and $U2_{cm}$. In other words, even if the values of the common mode voltages $U1_{cm}$ and $U2_{cm}$ are equal, the unwanted component at the output 117c of the third op amp would still exist. Mathematically, the common mode voltages $U1_{cm}$ and $U2_{cm}$ at the output 117c of the third op amp including any unwanted component or noise may be represented by:

$$(U1_{cm} - U2_{cm}) * \frac{Z2}{Z1} + \frac{U1_{cm}}{CMRR} \quad (2)$$

where CMRR is a common mode rejection ratio of the third op amp 117.

It should be appreciated that the output signal thus includes the signals as defined in equations (1) and (2).

To address the presence of the unwanted component, the digital band pass filter 120 is arranged to receive signals from the output 117c of the third op amp 117 to extract the portion of the output signal that corresponds to the control voltage frequency $f_0$ (i.e. as represented by $$U_{op} * \frac{Z2}{Z1} \text{ and } (U1_{cm} - U2_{cm}) * \frac{Z2}{Z1} + \frac{U1_{cm}}{CMRR})$$

to pass to the first level detector 121. The first level detector 121 next compares the portion of the output signal with a first threshold value. It is possible for the generation of the alarm signal to be based on the comparison but this may not be accurate. This is because of presence of machines or devices like the VFD 101 explained earlier which may generate high level common voltages with frequencies equal or close to the value $f_0$ of the control voltage frequency of the control voltage generator 107. This kind of common voltage noise may increase the output voltage value of the filter 120 which may cause the grounding monitoring device 10 to generate an alarm or equipment shutdown signal even when operator's resistance is within an acceptable limit. Power solenoids and some types of pulsed DC ionizers may also create similar noises as well.

Thus, this embodiment proposes using a second channel to determine if the alarm signal should be activated or not. In this respect, the comparator 22 further compares a portion of at least one of the first total signal and the second total signal that corresponds to the control voltage frequency $f_0$ with a second threshold value, and the alarm signal is generated based on this comparison and the comparison is performed by the second level detector 119. Specifically, the second digital band pass filer 118 extracts the portion of the first total signal that corresponds to the control voltage frequency $f_0$ (i.e. $U_{op}/2$ and $U1_{cm}$) and passes the filtered portion of the first total signal to the second level detector 119 which compares the filtered portion with a second threshold value.

The maximum possible AC voltage value amplitude at the output of the second digital filter 118 created by control voltage generator 107 is equal to $U_{max}$ and may be a few tens of millivolt. This limit could be exceeded when some common voltage with a spectrum component $f_0$ exists on the input of operation amplifier 109. Such a common voltage also may create a signal on the output of the first band pass filter 120 which may cause the alarm or equipment shutdown signal generation.

To further enhance the accuracy, the grounding monitoring device 10 includes a third channel for comparison which takes into account the second total signal. As shown in FIG. 1, the third digital band pass filter 122 extracts the portion of the second total signal that corresponds to the control voltage frequency $f_0$ and passes the filtered portion (i.e. $-U_{op}/2$ and $U2_{cm}$) and of the second total signal to the third level detector 123 which compares the filtered portion with the second threshold value. The use of the proposed third channel is useful to address the problem of just one of the conductive portions 103 being exposed to the external noise or interference and the other conductive portion 104 is shielded or directly grounded. The outputs from the second and third detectors 119,123 may be used as additional parameters to influence whether the alarm signal is to be generated, which may be used to show that the user is influenced by the noise or interference having a spectral component close to the control voltage frequency $f_0$. This type of notification may be used for constant common mode voltages $U1_{cm}/U2_{cm}$ with the control voltage frequency $f_0$ presence indication, for example, when a DC pulse ionizer with an appropriate switching frequency is placed near the user of the grounding monitoring device 10 which may create problems for accurate grounding monitoring if the third channel is not used.

Under these circumstances, the alarm generation device 124 not only takes into account the output from the first level detector 121 but also the outputs from the second and third level detectors 119,123 (or at least one of these). In this embodiment, the alarm generation device 124 is configured to generate the alarm signal if:
  (i) the first level detector 121 detects that the portion of the output signal (which corresponds to the control voltage frequency f$_o$) is greater than the first threshold value; and
  (ii) the second and third detectors 119,123 detect that the portion of each one of the first total signal and the second total signal (which correspond to the control voltage frequency f$_o$) is less than the second threshold value.

Of course, depending on the application of the grounding monitoring device 10 and level of accuracy required, the grounding monitoring device 10 may only make use of one of the outputs of the second or third detectors 119,123. Under such a situation, the alarm signal may be generated if the portion of the output signal is greater than the first threshold value, and if the portion of at least one of the first total signal and the second total signal is less than the second threshold value. It is also envisaged that the alarm signal may be generated if the portion of at least one of the first total signal and the second total signal is greater than the second threshold value.

Figure 2:
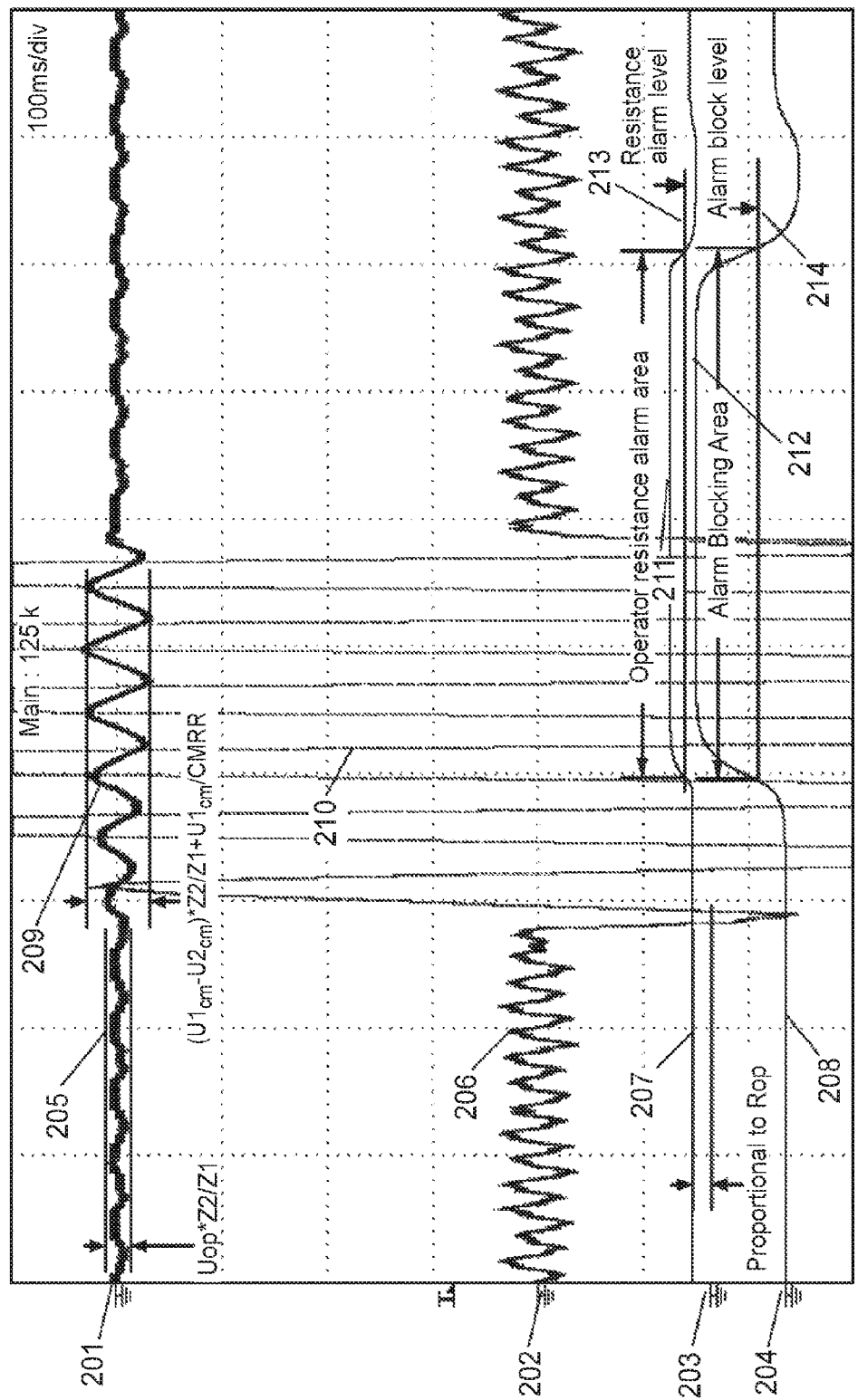
FIG. 2 is a graph showing various signals at respective points of the grounding monitoring device of FIG. 1 with the grounding monitoring device being exposed to a 20 Hz noise signal.

FIG. 2 illustrates signal waveforms at various stages of the grounding monitoring device 10 (in particular the output signal and signals along the second channel) to illustrate effects of the grounding monitoring device 10 before and after being affected by the external intermittent noise 102 with a spectrum of 20 Hz component present (i.e. close to the control voltage frequency f$_o$). Graph 201 illustrates a main voltage signal at the output 117c of the third op amp 117, and Graph 202 illustrates a secondary voltage signal at the output 109c of the first op amp 109, before digital filtering. Graphs 203 and 204 represent respectively a main filtered voltage signal at the output of the first digital filter 120 after converting from an analog to a digital signal which corresponds to the main voltage signal, and a secondary filtered voltage signal at the output of the second digital filter 118 after converting from an analog to a digital signal which corresponds to the secondary voltage signal.

A first portion 205 of the Graph 201 represents the main voltage signal as represented by $$U_{op} * \frac{Z2}{Z1}$$

and it should be appreciated that this peak-to-peak voltage is proportional to the value R$_{op}$ of the equivalent skin resistance 105 and a first portion 207 of Graph 203 is the corresponding main filtered signal which has a constant DC level lower than the first threshold 213. It should be mentioned that the portion 205 exhibits a generally square symmetrical pulse signal of about 20 Hz.

In other words, the first portions 205 and 207 illustrate the signals when the grounding monitoring device 10 is not exposed to the external intermittent noise 102. Under such circumstances, a first portion 206 of the Graph 202 shows that the output 109c of the first op amp 109 has a small common voltage U1$_{cm}$ of about 50 Hz which corresponds to a zero value at the output of the second digital filter 118 (i.e. the secondary filtered voltage signal) as shown by a first portion 208 of the Graph 204. It should be appreciated that the zero value of the first portion 208 is below the second threshold 214.

An effect of the user (wearing the wrist strap 12) being exposed to the external intermittent noise 102 is illustrated in a second portion 210 of the Graph 202 which shows a great jump in the common voltage U1$_{cm}$. This causes the output 117c of the third op amp 117 to increase as shown by a second portion 209 of the Graph 201 and this corresponds to the unwanted component represented by equation (2) above. The effects of the noise 102 also create similar replies at the outputs of both filters 120,118 as illustrated by respective second portions 211,212 of Graphs 203,204 so that the first and second level detectors 121,119 would detect that the levels of the first and second thresholds (represented as resistance alarm level 213 and alarm block level 214 in FIG. 2) are exceeded. In this example, no alarm signal is generated by the alarm generation device 124 since the grounding monitoring device 10 determined that the change in operator resistance is due to noise interference and is not a genuine grounding issue.

Figure 3:
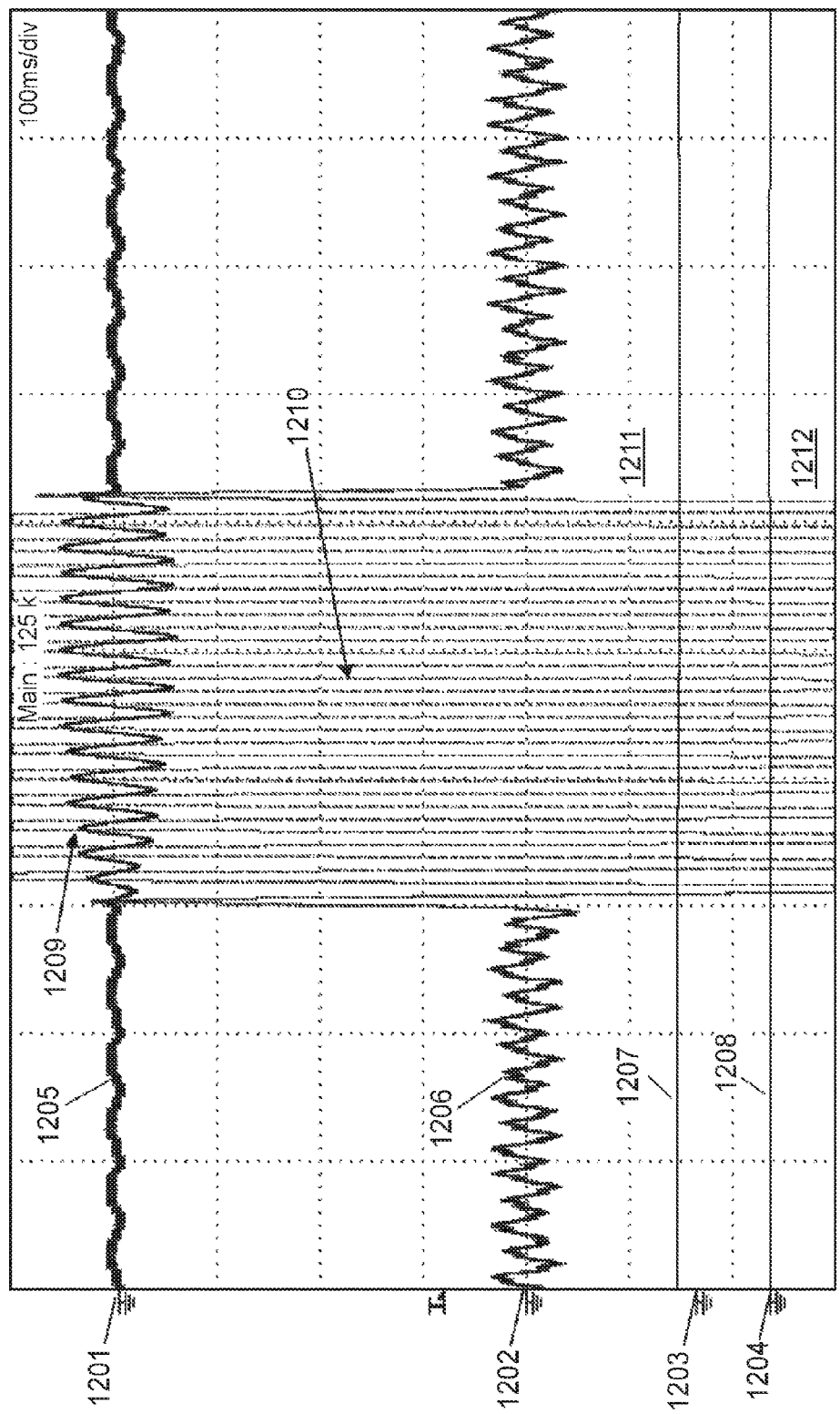
FIG. 3 is a graph showing the same signals as FIG. 2 but with the grounding monitoring device exposed to a 50 Hz noise signal.

FIG. 3 illustrates what happens when the grounding monitoring device 10 is exposed to a 50 Hz noise signal, and the same references used in FIG. 2 are used in FIG. 3 with the addition of 1000 so that it is easier to appreciate the differences. At the second portion 1210 of the Graph 1202, the grounding monitoring device 10 is exposed to an external intermittent noise signal of about 50 Hz and as seen in second portions 1211,1212 of the Graphs 1203,1204, the outputs of the digital filters 120,118 are not affected by the intermittent noise signal. As a result, the alarm generation device 124 does not generate the alarm signal.

It should be appreciated that in the described embodiment, an advantage is that with the use of an additional channel in the measurement, it is possible to eliminate the impact of some kinds of external noises at the manufacturing areas and provides information about the noise presence. In other words, the risk of generating false alarms is reduced. Further, the proposed grounding monitoring device 10 may be implemented in a low-cost manner without much (if any) price difference with existing grounding monitoring devices.

The described embodiment should not be construed as limitative. For example, in the described embodiment, the second digital band pass filter 118 has parameters strictly identical to the parameters of the first digital band pass filter 120, although this may not be so. Further, the filter 24 may not be necessary. Also, even though the band pass filters 120, 118, 122 and the level detectors 121, 119, 123 etc are shown separately, it should be appreciated that these parts may be implemented as a single device or separately.

The described embodiment uses the reference sine signal as the control voltage but it should be appreciated that the control voltage may take other forms. For example, the control voltage may be a square wave with at the control voltage frequency f$_o$, and the first voltage (applied at the first conductive portion 103) ranging from zero to V$_{max}$, and the second voltage (applied at the second conductive portion 104) ranging from V$_{max}$ to zero.

Further, the electrical circuit 20 includes three operational amplifiers (op amps) 109, 112, 117 configured as an instrumentation amplifier. However, the electrical circuit 20 may be configured differently and indeed, one of the op amps 109,112 may be omitted from the circuit 20.

The wrist strap 12 may not form part of the grounding monitoring device and it is possible that the wrist strap 12 may be provided separately and the grounding monitoring device includes a socket for receiving a plug or electrical connector of the wrist strap 12.

The following are items of the present disclosure:
Item 1 is a grounding monitoring device, comprising:

a wrist strap comprising:
  a first conductive portion for providing a first discharge path between a human part and a ground; and
  a second conductive portion electrically isolated from the first conductive portion for providing a different second discharge path between the human part and the ground;
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit; and
a comparator for:
comparing a portion of the output signal that corresponds to the frequency with a first threshold value; and
comparing a portion of at least one of the first total signal and the second total signal that corresponds to the frequency with a second threshold value; wherein an alarm signal is activated depending on the comparisons made by the comparator.

Item 2 is the grounding monitoring device of item 1, wherein each of the first and second discharge paths comprises at least one resistor.

Item 3 is the grounding monitoring device of item 1, wherein each of the first and second discharge paths comprises a same first resistor and a same second resistor.

Item 4 is the grounding monitoring device of item 1, wherein the signal source comprises a bipolar signal source.

Item 5 is the grounding monitoring device of item 1, wherein the first and second voltages have a same amplitude.

Item 6 is the grounding monitoring device of item 1, wherein each of the first and second voltages is a square wave at the frequency, the first voltage ranging from zero to $V_{max}$, and the second voltage ranging from $V_{max}$ to zero.

Item 7 is the grounding monitoring device of item 1, wherein the frequency is not 50 or 60 Hz, or a harmonic of 50 or 60 Hz.

Item 8 is the grounding monitoring device of item 1, wherein the frequency is less than 50 Hz.

Item 9 is the grounding monitoring device of item 1, wherein the frequency is 20 Hz.

Item 10 is the grounding monitoring device of item 1, wherein the electrical circuit comprises at least two operational amplifiers.

Item 11 is the grounding monitoring device of item 1, wherein the electrical circuit comprises at least two impedances.

Item 12 is the grounding monitoring device of item 1, wherein the comparator comprises:
  a first comparator for comparing the portion of the output signal that corresponds to the frequency with the first threshold value; and
  a different second comparator for comparing the portion of at least one of the first total signal and the second total signal that corresponds to the frequency with the second threshold value.

Item 13 is the grounding monitoring device of item 1, wherein the comparator comprises a filter for extracting:
  the portion of the output signal that corresponds to the frequency; and
  the portion of at least one of the first total signal and the second total signal that corresponds to the frequency.

Item 14 is the grounding monitoring device of item 13, wherein the filter comprises:
  a first filter for extracting the portion of the output signal that corresponds to the frequency; and
  a different second filter for extracting the portion of at least one of the first total signal and the second total signal that corresponds to the frequency.

Item 15 is the grounding monitoring device of item 1, wherein the alarm signal is generated if:
  the portion of the output signal that corresponds to the frequency is greater than the first threshold value; and
  the portion of at least one of the first total signal and the second total signal that corresponds to the frequency is less than the second threshold value.

Item 16 is the grounding monitoring device of item 1, wherein the alarm signal is generated if:
  the portion of the output signal that corresponds to the frequency is greater than the first threshold value; and
  the portion of each one of the first total signal and the second total signal that corresponds to the frequency is less than the second threshold value.

Item 17 is the grounding monitoring device of item 1, wherein the alarm signal is not generated if:
  the portion of the output signal that corresponds to the first frequency is greater than the first threshold value; and
  the portion of at least one of the first total signal and the second total signal that corresponds to the frequency is greater than the second threshold value.

Item 18 is the grounding monitoring device of item 1, wherein:
  the first total signal comprises at least a portion of the first voltage; and
  the second total signal comprises at least a portion of the second voltage.

Item 19 is the grounding monitoring device of item 1, wherein at least one of the first and second total signals comprises a noise signal at least at the frequency.

Item 20 is the grounding monitoring device of item 19, wherein a ratio of an amplitude of the noise signal to an amplitude of the first or second voltage is at least 20.

Item 21 is the grounding monitoring device of item 1, wherein the electrical circuit comprises:
  a first resistor having a first value connecting a first output terminal of the signal source to the first conductive portion and to a non-inverting input of a first operational amplifier;
  a second resistor having a second value connecting the first output terminal of the signal source to the ground;
  a third resistor having the first value connecting a second output terminal of the signal source to the second conductive portion and to a non-inverting input of a second operational amplifier; and
  a fourth resistor having the second value connecting the second output terminal of the signal source to the ground.

Item 22 is the grounding monitoring device of item 21, wherein:
  an output of the first operational amplifier is connected to an inverting input of the first operational amplifier; and
  an output of the second operational amplifier is connected to an inverting input of the second operational amplifier.

Item 23 is the grounding monitoring device of item 22, wherein:

a first impedance having a first value connects the output of the first operational amplifier to a non-inverting input of a third operational amplifier;
a second impedance having a second value connects the non-inverting input of the third operational amplifier to the ground;
a third impedance having the first value connects the output of the second operational amplifier to an inverting input of the third operational amplifier; and
a fourth impedance having the second value connects the inverting input of the third operational amplifier to the ground.

Item 24 is the grounding monitoring device of item 23, wherein the comparator:
compares a portion of an output signal of the third operational amplifier that corresponds to the first frequency with the first threshold value; and
compares the portion of at least one of the output signals of the first and second operational amplifiers that corresponds to the first frequency with the second threshold value.

Item 25 is the grounding monitoring device of item 1, wherein the human part is an arm.

Item 26 is a grounding monitoring device adapted to be connected to a wrist strap, the wrist strap comprising a first conductive portion for providing a first discharge path between a human part and a ground; and a second conductive portion electrically isolated from the first conductive portion for providing a different second discharge path between the human part and the ground, the grounding monitoring device comprising:
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit;
a comparator for:
comparing a portion of the output signal that corresponds to the first frequency with a first threshold value; and
comparing a portion of at least one of the first total signal and the second total signal that corresponds to the first frequency with a second threshold value; and wherein an alarm signal is activated depending on the comparisons made by the comparator.

Having now fully described the invention, it should be apparent to one of ordinary skill in the art that many modifications can be made hereto without departing from the scope as claimed.

The invention claimed is:

1. A grounding monitoring device for use with a human part, the grounding monitoring device comprising:
a wrist strap comprising:
a first conductive portion for providing a first discharge path between the human part and a ground; and
a second conductive portion for providing a different second discharge path between the human part and the ground;
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit; and
a comparator for:
comparing a portion of the output signal that corresponds to the frequency with a first threshold value; and
comparing a portion of at least one of the first total signal and the second total signal that corresponds to the frequency with a second threshold value; wherein an alarm signal is activated if:
the portion of the output signal that corresponds to the frequency is greater than the first threshold value, and
the portion of at least one of the first total signal and the second total signal that corresponds to the frequency is less than the second threshold value.

2. The grounding monitoring device of claim 1, wherein the electrical circuit comprises at least two operational amplifiers.

3. The grounding monitoring device of claim 1, wherein the comparator comprises:
a first comparator for comparing the portion of the output signal that corresponds to the frequency with the first threshold value; and
a different second comparator for comparing the portion of at least one of the first total signal and the second total signal that corresponds to the frequency with the second threshold value.

4. The grounding monitoring device of claim 1, wherein the alarm signal is activated if:
the portion of each one of the first total signal and the second total signal that corresponds to the frequency is less than the second threshold value.

5. The grounding monitoring device of claim 1, wherein the alarm signal is not activated if:
the portion of at least one of the first total signal and the second total signal that corresponds to the frequency is greater than the second threshold value.

6. A grounding monitoring device for use with a human part, the grounding monitoring device comprising:
a wrist strap comprising:
a first conductive portion for providing a first discharge path between the human part and a ground; and
a second conductive portion for providing a different second discharge path between the human part and the ground;
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit; and
a comparator for:
comparing a portion of the output signal that corresponds to the frequency with a first threshold value; and comparing a portion of at least one of the first total signal and the second total signal that corresponds to the frequency with a second threshold value, wherein an alarm signal is activated depending on the comparisons made by the comparator, and wherein the comparator comprises a filter for extracting:
the portion of the output signal that corresponds to the frequency; and
the portion of at least one of the first total signal and the second total signal that corresponds to the frequency.

7. The grounding monitoring device of claim 6, wherein the filter comprises:
a first filter for extracting the portion of the output signal that corresponds to the frequency; and
a different second filter for extracting the portion of at least one of the first total signal and the second total signal that corresponds to the frequency.

8. A grounding monitoring device for use with a human part, the grounding monitoring device comprising:
a wrist strap comprising:
a first conductive portion for providing a first discharge path between the human part and a ground; and
a second conductive portion for providing a different second discharge path between the human part and the ground;
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit,
wherein the electrical circuit comprises:
a first resistor having a first value connecting a first output terminal of the signal source to the first conductive portion and to a non-inverting input of a first operational amplifier;
a second resistor having a second value connecting the first output terminal of the signal source to the ground;
a third resistor having the first value connecting a second output terminal of the signal source to the second conductive portion and to a non-inverting input of a second operational amplifier; and
a fourth resistor having the second value connecting the second output terminal of the signal source to the ground, and
wherein the grounding monitoring device further comprises a comparator for:
comparing a portion of the output signal that corresponds to the frequency with a first threshold value; and
comparing a portion of at least one of the first total signal and the second total signal that corresponds to the frequency with a second threshold value, wherein an alarm signal is activated depending on the comparisons made by the comparator.

9. A grounding monitoring device adapted to be connected to a wrist strap, the wrist strap comprising a first conductive portion for providing a first discharge path between a human part and a ground; and a second conductive portion for providing a different second discharge path between the human part and the ground, the grounding monitoring device comprising:
a signal source for applying a first voltage at a frequency to the first conductive portion and an opposite second voltage at the frequency to the second conductive portion;
an electrical circuit for:
receiving a first total signal from the first conductive portion;
receiving a second total signal from the second conductive portion;
forming an output signal based on a differential and common mode gains of the electrical circuit;
a comparator for:
comparing a portion of the output signal that corresponds to the first frequency with a first threshold value; and
comparing a portion of at least one of the first total signal and the second total signal that corresponds to the first frequency with a second threshold value; and
wherein an alarm signal is activated if:
the portion of the output signal that corresponds to the frequency is greater than the first threshold value; and
the portion of at least one of the first total signal and the second total signal that corresponds to the frequency is less than the second threshold value.

10. The grounding monitoring device of claim 9, wherein the electrical circuit comprises at least two operational amplifiers.

11. The grounding monitoring device of claim 9, wherein the comparator comprises:
a first comparator for comparing the portion of the output signal that corresponds to the frequency with the first threshold value; and
a different second comparator for comparing the portion of at least one of the first total signal and the second total signal that corresponds to the frequency with the second threshold value.

12. The grounding monitoring device of claim 9, wherein the comparator comprises a filter for extracting:
the portion of the output signal that corresponds to the frequency; and
the portion of at least one of the first total signal and the second total signal that corresponds to the frequency.

13. The grounding monitoring device of claim 12, wherein the filter comprises:
a first filter for extracting the portion of the output signal that corresponds to the frequency; and
a different second filter for extracting the portion of at least one of the first total signal and the second total signal that corresponds to the frequency.

14. The grounding monitoring device of claim 9, wherein the alarm signal is activated if:
the portion of each one of the first total signal and the second total signal that corresponds to the frequency is less than the second threshold value.

15. The grounding monitoring device of claim 9, wherein the alarm signal is not activated if:
the portion of at least one of the first total signal and the second total signal that corresponds to the frequency is greater than the second threshold value.

16. The grounding monitoring device of claim 9, wherein the electrical circuit comprises:

a first resistor having a first value connecting a first output terminal of the signal source to the first conductive portion and to a non-inverting input of a first operational amplifier;
a second resistor having a second value connecting the first output terminal of the signal source to the ground;
a third resistor having the first value connecting a second output terminal of the signal source to the second conductive portion and to a non-inverting input of a second operational amplifier; and
a fourth resistor having the second value connecting the second output terminal of the signal source to the ground.

* * * * *